(12) United States Patent
Kempen

(10) Patent No.: US 8,865,254 B2
(45) Date of Patent: Oct. 21, 2014

(54) METHOD FOR APPLYING A MATERIAL ONTO A SUBSTRATE USING A DROPLET PRINTING TECHNIQUE

(75) Inventor: Antonius T. W. Kempen, Den Bosch (NL)

(73) Assignee: Nederlandse Organisatie Voor Toegepast-Natuurwetenschappelijk Onderzoek Tno, Delft (NL)

( * ) Notice: Subject to any disclaimer, the term of this patent is extended or adjusted under 35 U.S.C. 154(b) by 2147 days.

(21) Appl. No.: 11/631,316

(22) PCT Filed: Jul. 4, 2005

(86) PCT No.: PCT/NL2005/000475
§ 371 (c)(1),
(2), (4) Date: Apr. 4, 2007

(87) PCT Pub. No.: WO2006/004406
PCT Pub. Date: Jan. 12, 2006

(65) Prior Publication Data
US 2008/0193641 A1    Aug. 14, 2008

(30) Foreign Application Priority Data
Jul. 2, 2004    (EP) .................................... 04076925

(51) Int. Cl.
*B05D 5/00* (2006.01)
*H05K 3/12* (2006.01)
*B41J 2/17* (2006.01)

(52) U.S. Cl.
CPC ........ *H05K 3/125* (2013.01); *H05K 2203/1105* (2013.01); *B41J 2/17* (2013.01)

USPC .......................................................... 427/226

(58) Field of Classification Search
USPC .................................................. 427/226, 229
See application file for complete search history.

(56) References Cited

U.S. PATENT DOCUMENTS

| | | | |
|---|---|---|---|
| 4,072,771 A * | 2/1978 | Grier, Sr. ....................... | 427/120 |
| 6,401,001 B1 | 6/2002 | Jang et al. | |
| 2003/0032214 A1 | 2/2003 | Huang | |
| 2003/0146019 A1 * | 8/2003 | Hirai .............................. | 174/257 |
| 2004/0028592 A1 * | 2/2004 | Akimoto et al. .............. | 423/263 |

FOREIGN PATENT DOCUMENTS

| EP | 0930641 | * | 1/1999 |
|---|---|---|---|
| EP | 0 930 641 | | 7/1999 |
| EP | 0930641 | * | 7/1999 |

OTHER PUBLICATIONS

International Search Report for PCT/NL2005/000475 mailed Oct. 7, 2005.

* cited by examiner

*Primary Examiner* — Robert Vetere
(74) *Attorney, Agent, or Firm* — Nixon & Vanderhye P.C.

(57) ABSTRACT

The invention provides a method for applying a material onto a substrate using a droplet printing technique, wherein the material is provided in the form of a solution of a precursor of the material or a suspension of the material, droplets are generated from the solution or the suspension and the droplets are heated before they are deposited on the substrate.

9 Claims, No Drawings

METHOD FOR APPLYING A MATERIAL ONTO A SUBSTRATE USING A DROPLET PRINTING TECHNIQUE

This application is the U.S. national phase of international application PCT/NL2005/000475 filed 4 Jul. 2005 which designated the U.S. and claims priority to EP 04076925.9 filed 2 Jul. 2004, the entire contents of each of which are hereby incorporated by reference.

The present invention relates to a method for applying a material onto a substrate using a droplet printing technique.

Droplet printing techniques are nowadays widely applied for the formation of two-dimensional bodies and three-dimensional bodies using computer-generated design data. In general either a continuous droplet printing technique or a drop-on-demand droplet printing technique will be used. In the former technique a back-pressure is applied to the reservoir of liquid material to be used, whereby mechanical vibration is constantly used to produce a stream of small uniform droplets. This technique applies a high constant frequency, allowing the droplets may be produced at rates of thousands of droplets per second. The drop-on demand techniques differs, however, from the former technique in that only low frequencies are applied, and only when needed, allowing droplets to be produced at rates in the order of hundreds of droplets per second.

Typical two-dimensional bodies include films such as electrical insulators and semiconductors, whereas three-dimensional bodies include a large variety of products such as functioning prototypes, moulds, tools and articles. Materials that can suitably be used in these applications include polymers, metals and ceramic materials.

A problem associated with metal droplet printing techniques is that the formation of small metal droplets requires the use of a small tube in the droplet generator, which tube is unfortunately sensitive to blockage by the metal droplets. In addition, it is noted that molten metal is aggressive in the sense that it causes the formation of corrosion products, which in turn contributes to the blockage problem. Obviously, this problem increases when molten metals are used having a higher melting point, since such molten metals behave more aggressively.

In an alternative droplet printing technique used in the manufacture of two-dimensional bodies, droplets consisting of a dry organometallic compound dissolved in an organic solvent are deposited on a substrate and after a layer of the droplets has been formed on the surface of the substrate, the layer is subjected to a heating treatment wherein pyrolysis of the organometallic compound takes place to allow a metal layer to be formed on the surface of the substrate. Since for each individual layer of droplets such heat treatment is required, it will be clear that such technique is time-consuming as well as expensive. An additional and more severe drawback is, however, the fact that the entire substrate needs to be heated for the pyrolysis of the organometallic compound. Consequently, the substrate needs to be heat resistant, which limits this technique significantly because it excludes the application of many combinations of substrates and printing materials Object of the present invention is to provide a printing droplet technique, which solves the above problems.

Surprisingly, it has now been found that this can be established when use is made of a method in which the material to be printed onto a substrate is applied in the form of a metal solution of which droplets are heated before they are deposited on the substrate.

Accordingly, the present invention relates to a method for applying a material onto a substrate using a droplet printing technique, which method comprises the steps of:
(a) providing a solution of a precursor of the material or a suspension of the material;
(b) generating droplets from the solution or the suspension, and releasing the droplets into the direction of the substrate; and
(c) heating the droplets before they are deposited on the substrate so as to establish:
(i) that the liquid medium used in the suspension is completely or substantially removed, whereby the material is allowed to melt when the liquid medium is removed completely; or
(ii) that the liquid medium used in the solution is completely removed, whereby pyrolysis of the precursor and melting of the material so obtained is allowed to take place when the precursor comprises a metal salt.

Preferably, the precursor comprises a metal salt or an organometallic compound and the suspension comprises a metal suspension, a polymer suspension or a ceramic suspension. More preferably, in step (a) a solution of a metal salt or a metal suspension is provided. Most preferably, a solution of a metal salt is provided in step (a). The metal salt constitutes the precursor of the corresponding metal to be obtained.

A wide range of metal salts can be used in accordance with the present invention. Suitable metal salts include those that have been derived from nickel, copper, gold, silver, platinum, aluminium, iron or palladium, preferably nickel or copper. Examples of such metal salts include metal nitrates or metal acetates, such as copper nitrate, copper acetate, nickel nitrate and nickel acetate.

An example of a suitable organometallic compound is for instance (1,5-cyclooctadiene-1,1,1,5,5,5-hexafluoroacetylacetonato)silver (I), also known as Ag(hfa)(COD).

Obviously, in the solution or suspension to be used in accordance with the present invention a liquid medium is used.

Suitable examples of such liquid media used in solutions of metal salts include water, alcohol and acetone, or mixtures thereof. Preferably, the liquid medium used in a solution of a metal salt comprises water. When use is made of an organometallic compound suitable liquid media include toluene and ethanol.

When a solution of a metal salt or an organometallic compound is used, the droplets of the solution are heated in such a way that pyrolysis of the metal salt or organometallic compound occurs and the metal thus obtained is melted into molten metal droplets. In case a metal suspension is used, the droplets of the metal suspension will be heated in such a way that the liquid medium used in the metal suspension is completely removed and the metal so obtained is melted in metal droplets.

The polymer of which the polymer suspension is made suitably comprises polystyrene, polypropylene, polyethylene, or acrylonitrile butadiene styrene.

Preferably, the polymer comprises polystyrene or polyethylene.

The liquid medium used in the polymer suspension suitably comprises water, alcohol or acetone. Preferably, the liquid medium used in the polymer suspension comprises water. If desired, mixtures of these liquid media can be applied.

When use is made of a polymer suspension, the droplets of the polymer solution are heated in such a way that the liquid medium used in the polymer suspension is completely removed and the polymer so obtained is melted in polymer droplets.

The ceramic suspension can suitably be made of a ceramic material selected from the group consisting of aluminium oxide, zirconium oxide, magnesium oxide, boron nitride, silicon carbide, silicon nitride and tungsten carbide.

Preferably, the ceramic material used in the ceramic suspension comprises aluminium oxide or zirconium oxide. More preferably, use is made of zirconium oxide.

The liquid medium use in the ceramic suspension suitably comprises water, alcohol or acetone. Preferably, the liquid medium used in the ceramic suspension comprises water. If desired, mixtures of these liquid media can be applied.

When a ceramic suspension is used in the method according to the invention, the droplets of the ceramic suspension are heated in such a way that the liquid medium used in the ceramic suspension is substantially removed and the remaining droplets of the ceramic suspension are allowed to deposit on the substrate. In the context of the present invention with "substantially" is meant that at least 50% of the liquid medium used in the ceramic suspension is removed. Preferably, more than 70% of the liquid medium is removed, more preferably more than 80% of the liquid medium is removed.

In step (c) the droplets can suitably be heated by means of contact-free heating equipment, i.e. equipment which heats the droplets without being in direct contact with the droplets. Examples of such equipment include heating spirals, microwave devices in case aqueous solutions are used, laser heating and induction heating devices.

It will be understood that in step (c) the droplets are exposed to a temperature, which is at least equal to the boiling temperature of the liquid medium used in the solution or the suspension. Preferably, the droplets are exposed to a temperature in step (c), which is larger than the boiling temperature of the liquid medium used in the solution or the suspension.

When a solution of a metal salt or an organometallic compound is used or a metal suspension, the liquid medium will generally evaporate at a temperature in the range of from 50-200° C., whereas pyrolysis of the metal salt obtained from the solution will generally take place at a temperature in the range of from 100-1000° C., and the metal obtained from the suspension will generally melt at a temperature in the range of from 500-1500° C.

When a ceramic suspension or a polymer suspension are used the liquid medium will also generally evaporate at a temperature in the range of from 50-200°, whereas the polymer obtained from the polymer suspension will generally melt at a temperature in the range of from 80-300°.

It will be understood that said temperature ranges will depend on the choice of the liquid medium applied and the pressure used.

In accordance with the present invention a variety of substrates can suitably be used. Examples of suitable substrates include metals, polymers and ceramics. One of the major advantages of the present invention is the fact that also variety of low melting substrates can suitably be used. Suitable examples of low melting substrates include polymers such as polyethylene, and polystyrene.

The skilled person in the art will understand that in practice after the droplets have been heated in step (c), they will be charged by means of a charge electrode and subsequently passed through conventional deflection means to make sure that they reach the intended location on the substrate.

The droplet printing technique to be used in accordance with the present invention can either be a continuous droplet printing technique or a drop-on-demand droplet printing technique. Preferably, however, use is made of a continuous droplet printing technique.

In the method according to the present invention use can be made of droplet printing equipment known in the art, provided that up-flow the charge electrode, heating means are located for carrying out step (c). An apparatus suitable for carrying out the method according to the present invention is for instance described in WO 2004/018212 A1 which patent specification is hereby incorporated by reference.

The present invention also relates to products that have been manufactured by using the method according to any one of claims 1-9 until the desired form of the product is shaped.

Products that can be manufactured using the method according to the present invention include two-dimensional and three-dimensional bodies electrical insulators, semiconductors, functioning prototypes, moulds, tools and a large variety of articles such as custom jewellery, conductive tracks such as for instance those on Printed Circuit Boards, custom made medical implants, and small complex engineering parts such as pump rotors.

The invention claimed is:

1. A method for applying a material onto a substrate using a droplet printing technique, which method comprises the steps of:
   (a) providing a solution of a precursor of the material or a suspension of the material in a liquid medium;
   (b) generating droplets from the solution or the suspension, and releasing the droplets into the direction of the substrate; and
   (c) exposing the droplets to a temperature which is equal to or larger than the boiling temperature of the liquid medium before they are deposited on the substrate so as to establish:
   (i) that the liquid medium is completely removed when the suspension comprises a metal or polymer suspension, or the liquid medium used in the suspension is for at least 50% removed when the suspension comprises a ceramic suspension, whereby the material is allowed to melt when the liquid medium is removed completely; or
   (ii) that the liquid medium is completely removed, whereby pyrolysis of the precursor and melting of the material is allowed to take place when the precursor comprises a metal salt, thereby yielding molten droplets of the material; and thereafter
   (d) flowing the molten droplets to the intended location on the substrate and depositing the molten droplets on the substrate.

2. A method according to claim 1, wherein the precursor comprises a metal salt or an organometallic compound and the suspension comprises a metal suspension, a polymer suspension or a ceramic suspension.

3. A method according to claim 2, wherein in step (a) a solution of a metal salt is provided.

4. A method according to claim 2, wherein the metal comprises nickel, copper, gold, silver, platinum, iron, aluminium or palladium.

5. A method according to claim 4, wherein the metal comprises nickel or copper.

6. A method according to claim 2, wherein the polymer comprises polystyrene, polypropylene, polyethylene, or acrylonitrile butadiene styrene.

7. A method according to claim 6, wherein the polymer comprises polystyrene or polyethylene.

8. A method according to claim 2, wherein the ceramic suspension comprises a ceramic material selected from the group consisting of aluminiumoxide, zirconiumoxide, magnesiumoxide, boronnitride, siliconcarbide, siliconnitride and tungstencarbide.

9. A method according to claim 8, wherein the ceramic material comprises aluminiumoxide or zirconiumoxide.

* * * * *